(12) United States Patent
Long et al.

(10) Patent No.: US 7,091,613 B1
(45) Date of Patent: Aug. 15, 2006

(54) ELONGATED BONDING PAD FOR WIRE BONDING AND SORT PROBING

(75) Inventors: Jon M. Long, Livermore, CA (US); Joseph W. Foerstel, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/699,118

(22) Filed: Oct. 31, 2003

(51) Int. Cl.
*H01L 23/48* (2006.01)

(52) U.S. Cl. .................. 257/758; 257/736; 257/760; 257/774; 257/780

(58) Field of Classification Search ........... 257/780, 257/785, 786
See application file for complete search history.

(56) References Cited

U.S. PATENT DOCUMENTS 6,765,228 B1 * 7/2004 Lin et al. ............... 257/48
6,844,631 B1 * 1/2005 Yong et al. ............ 257/786

* cited by examiner

*Primary Examiner*—Wai-Sing Louie
(74) *Attorney, Agent, or Firm*—Morgan, Lewis & Bockius LLP

(57) ABSTRACT

An elongated bonding pad comprises two areas, a bonding area and an elongated probing area. The bonding area is located on the edge of an integrated circuit device for wire bonding. The elongated probing area is located on the inner area of the device. The long dimension of the elongated probing area is large enough for carrying a probing mark and the short dimension of the probing area is electrically and mechanically connected to the bonding area. Such elongated bonding pad can reduce the possibility of bonding wire open failures caused by wafer sort probing and increase the device's capacity of hosting more electrical components.

10 Claims, 4 Drawing Sheets

ELONGATED BONDING PAD FOR WIRE BONDING AND SORT PROBING

BACKGROUND OF THE INVENTION

This invention relates generally to bonding pad structures for integrated circuits. More particularly, this invention relates to a bonding pad structure that has separate areas for wire bonding and wafer sort probing such that smaller pad pitches can be assembled without increasing the yield loss due to probing and a probing pin can make a better contact with an integrated circuit without increasing the circuit size.

DESCRIPTION OF THE RELATED ART

Integrated circuit (IC) devices are typically manufactured on a semiconductor wafer. A single wafer typically has a two-dimensional array of numerous IC devices defined thereon and each device comprises numerous electrical components and a collection of bonding pads. The bonding pads are usually made of aluminum or copper and deployed on the perimeter of the device's upper surface. The rest of the device's upper surface is coated with a layer of insulating material such as silicon nitride, commonly referred to as the passivation layer, so as to protect the device from various environmental impacts. Following manufacture, the devices are separated from the wafer and mounted in device packages. A principal function of the bonding pads is to provide electrical connections through bonding wires from the device to pin leads on a package hosting the device. The upper surface of each bonding pad is usually covered with a thin non-conductive layer of aluminum oxide, which needs to be removed or broken through so as to obtain a reliable contact with the bonding wires.

Since IC packaging is an expensive process, it is desirable to evaluate the quality of a device while it is still part of a wafer to avoid packaging a defective device. Therefore, another important function of the bonding pads is to provide electrical connections during such evaluation, which is commonly referred to as wafer sort probing. Wafer sort probing is performed by an electrical tester that uses a probing card having a plurality of electrical probing pins that contact the device's bonding pads in place of the normal bonding wires. The electrical tester provides signals through the probing pins on the probing card and the bonding pads to the device and receives back signals from the device through the same route. Based on the analysis of the received signals, the tester produces a preliminary report on the quality and performance of the tested device. If the tested device fails to meet a predetermined standard, it will be rejected by producing an ink mark on its upper surface or marking its position on an electronic wafer map associated with the wafer carrying the device. After the wafer is separated into individual dice, only those devices that have passed wafer sort probing are chosen for packaging or further testing.

The thin layer of aluminum oxide on a bonding pad also presents a challenge for the electrical contact between a probing pin and a bonding pad. To break through the aluminum oxide layer, each probing pin on the probing card first pushes through the aluminum oxide layer and enters into the aluminum layer of the bonding pad, and then pulls itself across the bonding pad surface to produce a 60 to 70 microns long probing mark. Since bonding pad surface damaged by the probing mark may no longer be suitable for wire bonding, and as a result, the bonding area available for wire bonding is reduced after wafer sort probing. Conventionally, this reduction of bonding area is not a serious problem since the size of a bonding pad, usually 100×100 microns$^2$, is large enough to meet the dual purposes of wire bonding and wafer sort probing.

However, with the rapid improvement of semiconductor technology, there is less space on the upper surface of a device available for deploying bonding pads of conventional dimension. First, higher circuit density makes it possible to implement more complex functionality in a single integrated circuit device that needs more bonding pads to support more input/output (IO) terminals. Second, many applications, such as mobile telecommunication devices, require that the overall dimension of an integrated circuit device be as small as possible, which also leaves less space for deploying bonding pads. In other words, the area available for each bonding pad is continuously decreasing. On the other hand, the dimension of a probing mark remains substantially unchanged (at least 60 microns long) in order to achieve a reliable connection between a probing pin and a bonding pad. As a result, the percentage of the area on the upper surface of a bonding pad needed for wafer sort probing keeps growing.

Therefore, it is desirable to develop a new bonding pad in which the bonding area is not disturbed by wafer sort probing while enough space is also reserved for wafer sort probing.

SUMMARY OF THE INVENTION

The present invention eliminates the aforementioned problems by providing a new bonding pad design. The new bonding pad comprises a bonding area for wire bonding and an elongated probing area for wafer sort probing. These two areas are electrically and mechanically connected to each other and are positioned in such a manner that wafer sort probing is less likely to cause damage to the bonding area. As a result, when advances in technology permit the use of thinner wires, the size of the bonding area can be reduced while the size of the elongated probing area remains changed.

In one aspect of the present invention, the bonding area is substantially a square and the elongated probing area is a rectangle. A plurality of bonding pads are disposed on the upper surface of an IC device such that the bonding areas are positioned on the perimeter of the device and the elongated probing areas are inside the perimeter. A side of a bonding area facing the interior of the upper surface of the IC device is connected to the short side of the corresponding elongated probing area.

In another aspect of the present invention, the bonding areas are positioned on top of a plurality of electrically connected metal layers serving as conductive paths for electrical signals and the corresponding probing areas are only on top of a subset of the metal layers. The reason for such arrangement is that wire bonding causes a significant amount of pressure on the IC device that requires more metal layers to sustain it in order to avoid damaging the device. In contrast, the amount of pressure produced by a probing pin on the device is much less likely to cause significant damage.

BRIEF DESCRIPTION OF THE DRAWINGS

For a better understanding of the present invention, reference should be made to the following detailed description taken in conjunction with the accompanying drawings in which.

DETAILED DESCRIPTION OF THE INVENTION

Figure 1B:
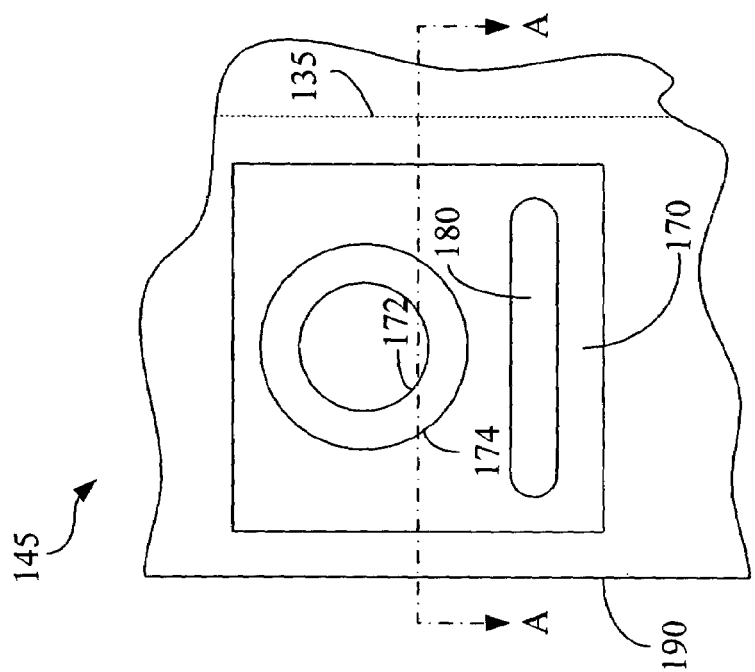
FIG. 1B is a plan view providing more details about a prior art bonding pad.
Figure 1A:
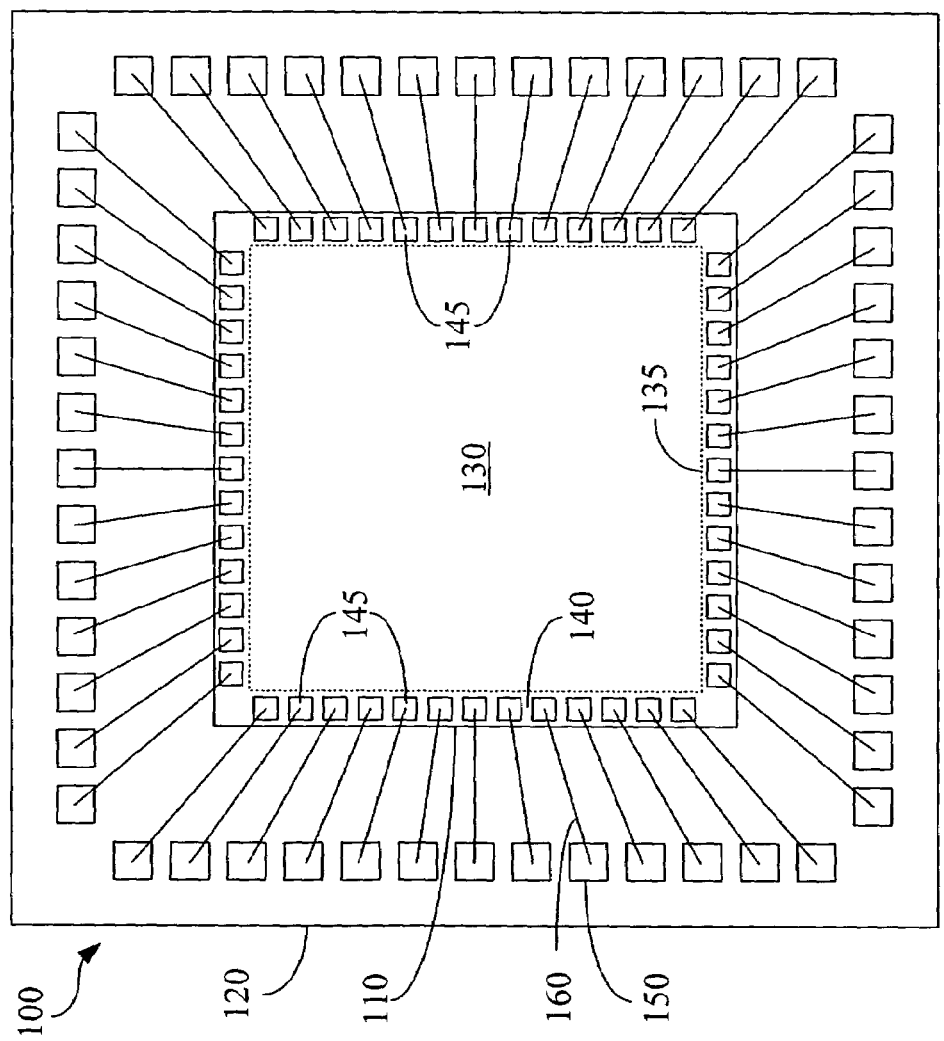
FIG. 1A is a plan view of a prior art integrated circuit package with a plurality of bonding pads distributed along the four edges of the semiconductor chip.

FIG. 1A depicts a typical semiconductor device package 100 of the prior art. An integrated circuit (IC) device 110 is mounted on top of a ceramic substrate or a printed circuit board 120. For illustrative purposes, device 110 is divided into two functional areas 130 and 140 by a dotted line 135. The inner area 130 is mainly used for fabricating electrical components including a plurality of transistors and capacitors in an underlying semiconductor substrate 210 (shown in FIG. 2) as well as for fabricating conductive paths above the substrate 210 to connect those components. The outer peripheral area 140 along the edges of IC device 110 is mainly used for deploying a plurality of square bonding pads 145 and connecting them to the conductive paths. Given the limited space on an IC device, the more space occupied by bonding pads, the less space available for manufacturing electrical components.

A plurality of lead heads 150 are disposed on the upper surface of substrate 120, surrounding IC device 110. A bonding wire 160 made of gold or aluminum connects a bonding pad 145 to a lead head 150. Each end of bonding wire 160 is melted on the surface of a bonding pad 145 and a lead head 150 using certain methods such as a thermal-sonic technique. Electronic signals are transmitted between electrical components in inner area 130 of IC device 110 and other IC devices that are mounted on other semiconductor packages through bonding pads 145, bonding wires 160, and lead heads 150 as well as conductive traces (not shown) embedded in substrate 120. Therefore, it is critical that the bonding pads 150 be properly connected to bonding wires 160 because any disconnection can cause the entire circuit not to function correctly.

FIG. 1B is a plan view that provides more details about the structure of a square bonding pad 145 close to edge 190 of device 110. To satisfy the dual purposes of wire bonding and wafer sort probing, a bonding pad 145 comprises two portions, bonding area 170 and probing area 180. An inner circle 172 in bonding area 170 represents the circumference of a bonding wire before being melted on the bonding pad and an outer circle 174 represents the area occupied by the melted end of a bonding wire, which is typically 45×45 microns². Probing area 180 which is usually 75 microns long is prepared for the probing pin of a probing card to travel across the bonding pad surface during wafer sort probing. The dimension of bonding pad 145 has to be large enough to host both the bonding area 170 and the probing area 180. For instance, the dimension of a typical prior art bonding pad is 100×100 microns².

However, there is a significant amount of IC space wasted by a bonding pad comprising a bonding area and a probing area shown in FIG. 1B, such as the area surrounding the bonding area 170. As a result, less space can be used for electrical component fabrication. Meanwhile, since the long edge of probing area 180 is so close to bonding area 170, a slight misalignment between the probing pin of a probing card and probing area 180 may result in severe damage to the entire circuit. For example, the probing pin may reach bonding area 170 and produce a probing mark on bonding area 170 during wafer sort probing, rendering IC device 110 unqualified for packaging. The disadvantage of such arrangement becomes more obvious in a cross-sectional view shown below.

Figure 2:
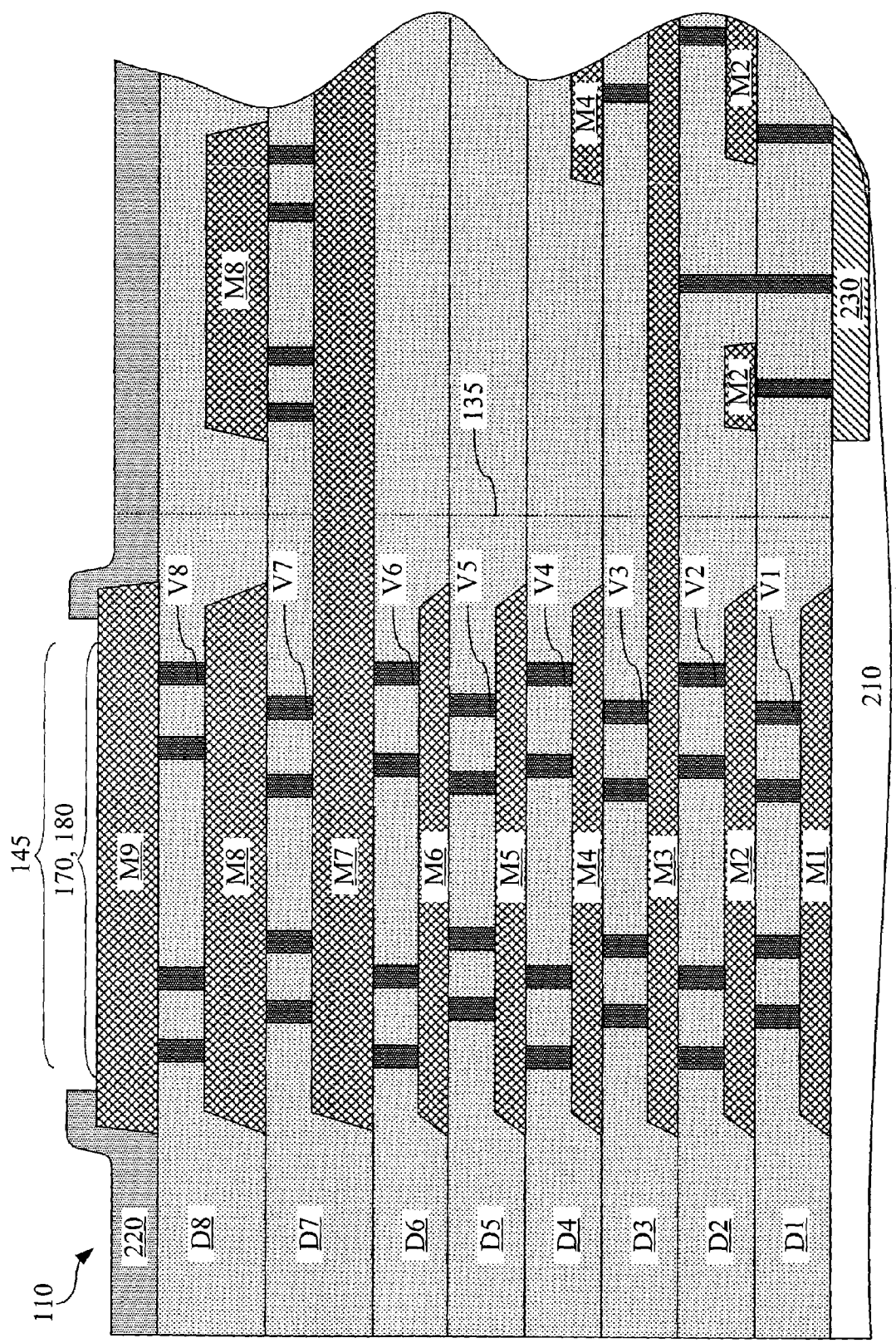
FIG. 2 is a cross-sectional view of a prior art multi-layer bonding pad structure.

FIG. 2 is a cross-sectional view along line A—A of FIG. 1B depicting a typical multi-layer bonding pad structure of the prior art. At the bottom of this structure is a semiconductor substrate 210 in which are formed a plurality of electrical components 230, such as transistors and capacitors of IC device 110. A plurality of metal layers M1–M9 made of aluminum, copper or tungsten alloy are deployed one on top of the other on the upper surface of semiconductor substrate 210 using techniques known in the art such as chemical vapor deposition. These metal layers are separated by a plurality of interconnect dielectric layers D1–D8 made of materials such as fluorine-doped silicate glass (FSG). Multiple through-hole vias such as V1–V8 are formed in dielectric layers D1–D8 using known techniques such as plasma etching; and metal materials such as copper or tungsten are then deposited into the holes to connect two adjacent metal layers. The metal layers are processed using known techniques to define conductive paths, schematically represented by the portions of metal layers M2, M3, M4, M7 and M8 to the right of dotted line 135, that connect electrical components 230 to bonding pads 145. A passivation layer 220 made of a material such as silicon nitride covers the upper surface of IC device 110. A portion of passivation layer 220 on top of bonding pad 145 is removed to expose metal layer M9 for wire bonding and wafer sort probing.

It is important to mention that bonding pad 145 is located on the outer peripheral area 140 of IC device 110 and there are numerous electrical components 230 including transistors or capacitors fabricated in semiconductor substrate 210 in the inner area 130 of device 110 (see FIG. 1A), which are electrically connected with one another through the conductive paths formed by the multiple metal layers to the right of dotted line 135 in FIG. 2. The top metal layer M9 of bonding pad 145 provides electrical and mechanical contact for a bonding wire and a probing pin of a probing card. While the vias V1–V8 that interconnect the metal layers M1–M9 are shown in FIG. 2 as being under bonding pad 145, it will be understood by those skilled in the art that the vias may also be located in the inner area 130 of IC device 110.

To produce a firm contact between bonding wire and metal layer M9, a bonding equipment has to exert a significant amount of pressure on metal layer M9. Such pressure may be beyond the limit that those electrical components 230 such as transistors or capacitors fabricated in the semiconductor substrate 210 can withstand. This is why there usually are no electrical components directly below a bonding pad 145. Meanwhile, bonding pad 145 has to be large enough as shown in FIG. 1B to accommodate both wire bonding and wafer sort probing. As a result, the more space on the upper surface of IC device 110 used for bonding pads, the less space left for in the substrate of device 110 the electrical components 230. This makes it more difficult to implement complex functionality given a IC device 110 of limited dimension, because complex functionality usually requires more electrical components and more I/O terminals (or bonding pads).

On the other hand, as noted when discussing FIG. 1B, it has been observed that a significant amount of space on a bonding pad is never used during either wire bonding or wafer sort probing, such as the area surrounding bonding area 170. Meanwhile, the pressure exerted by the probing pin of a probing card on a bonding pad is typically insignificant compared with the pressure produced by the bonding equipment. In other words, even if there are electrical components below the bonding pad, they should be able to survive the pressure caused by wafer sort probing. These two observations form the basis of the present invention. If a bonding pad is designed such that the probing area 180 of the bonding pad is positioned in the inner area 130 of an IC device 110 shown in FIG. 1A or to the right of dotted line 135 shown in FIG. 2 and only the bonding area 170 that needs multiple metal layers to sustain the wire bonding pressure remains on the perimeter of such device, a smaller portion of semiconductor substrate 210 and the space above it are needed for hosting such bonding pad, and therefore a larger portion of the semiconductor substrate 210 and the corresponding space above it can be used for fabricating electrical components and conductive paths that connect the components.

Figure 3B:
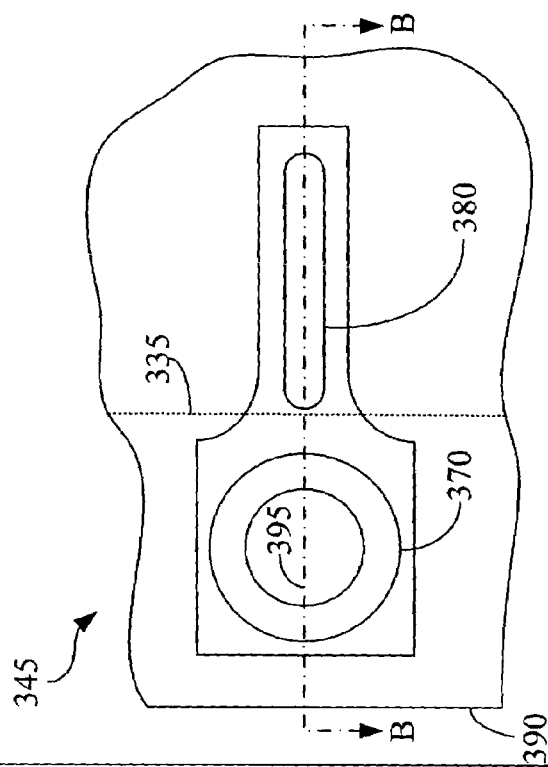
FIG. 3B is a plan view providing more details about a bonding pad in accordance with the present invention.
Figure 3A:
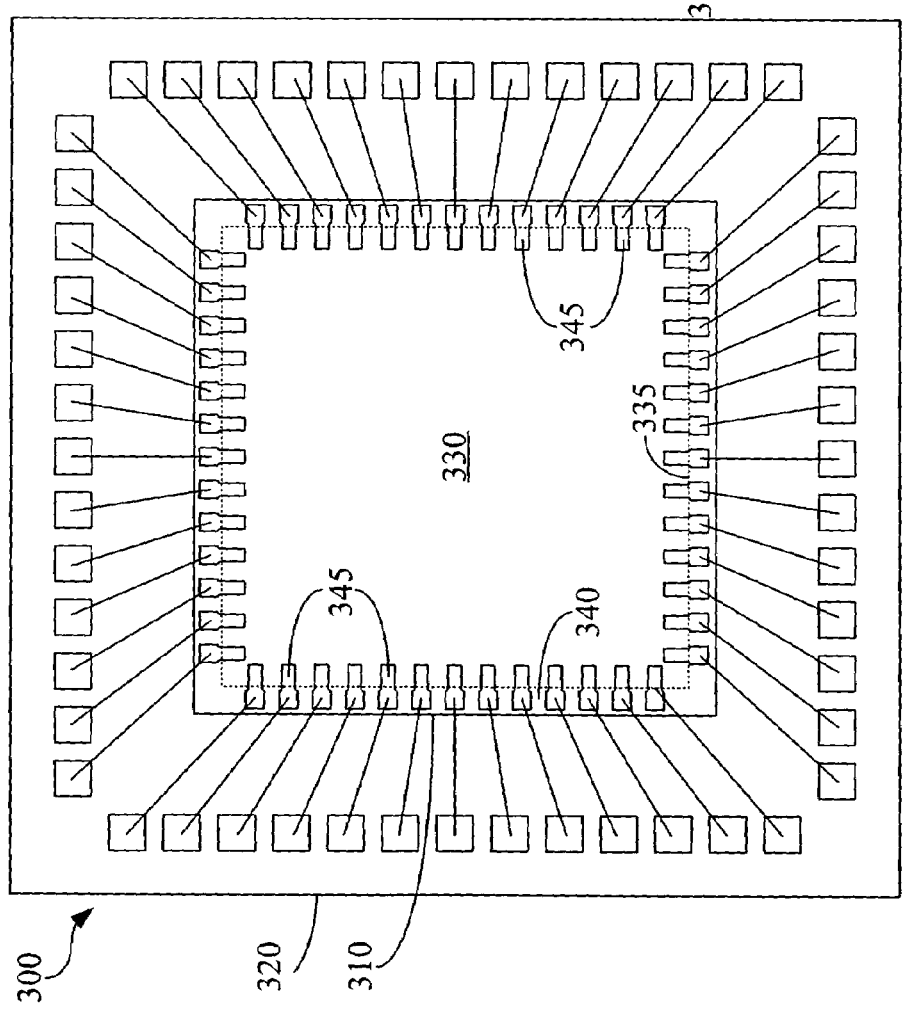
FIG. 3A is a plan view of an integrated circuit package in accordance with the present invention.
Figure 4:
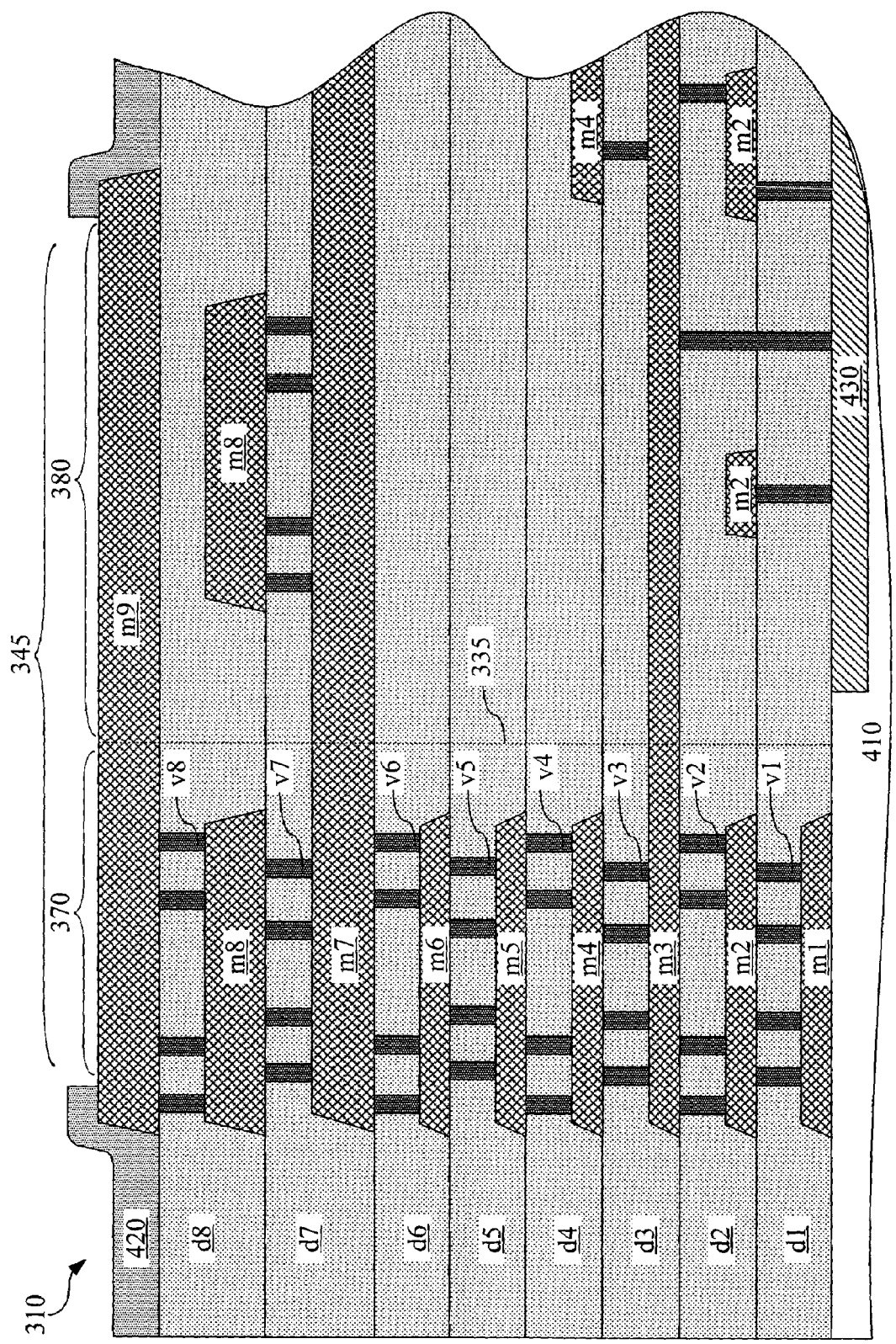
FIG. 4 is a cross-sectional view of a multi-layer bonding pad structure in accordance with the present invention.

FIGS. 3A, 3B and 4 depict one embodiment of the present invention, an elongated bonding pad. FIG. 3A represents a semiconductor device package 300 according to the present invention. For illustrative purposes, the dimension of IC device 310 is the same as that of IC device 110 and the dimension of substrate 320 is the same as that of substrate 120. Further, IC device 310 is divided by a dotted line 335 into an inner area 330 in which a plurality of electrical components are formed and an outer peripheral area 340. According to the present invention, each bonding pad 345 deployed on the edges of IC device 310 has a shape different from the shape of bonding pad 145 and, in particular, has a square bonding area 370 in the outer peripheral area 340 joined to an elongated probing area 380 that extends into the inner area 330. In contrast, both bonding area 170 and probing area 180 of bonding pad 145 are located to the left of dotted line 135 in FIG. 1B and in the outer peripheral area 140 in FIG. 1A. Since the size of bonding area 370, e.g., 55×55 microns$^2$, is significantly smaller than the size of bonding pad 145, e.g., 100×100 microns$^2$, the peripheral area 340 of IC device 310 is likewise significantly smaller and the inner area 330 of IC device 310 is significantly larger than the inner area 130 of device 110.

FIG. 3B depicts more details about the shape of elongated bonding pad 345 in accordance with the present invention. Similar to bonding pad 145 in FIG. 1B, bonding pad 345 comprises two areas, bonding area 370 and probing area 380. Unlike bonding pad 145 of FIG. 1B, probing area 380 is located to the inner side of dotted line 335 and bonding area 370 to the outer side of dotted line 335. Further, these two areas are deployed along an axis represented by a dash-dot line 395 perpendicular to dotted line 335 such that elongated bonding pad 345 has little space wasted in either area. Such arrangement solves the issues faced by conventional bonding pads as discussed above. First, since there is little pressure caused by wafer sort probing, probing area 380 can be deployed on top of electrical components in inner area 330 (this is more obvious in FIG. 4) and keep its dimension as large as 75 microns long for the probing pin of a probing card to achieve a better contact. Second, such arrangement also makes it less likely that bonding area 370 will be disturbed by the probing pin of a probing card during wafer sort probing whenever there is any misalignment. Therefore, the possibility of a bonding wire open (or a bonding wire not in sufficient contact with a bonding pad on an IC device) and potential yield loss caused by such bonding wire open can be significantly reduced.

FIG. 4 is a cross-sectional view along line B—B of FIG. 3 that makes the advantages of the present invention more apparent. Similar to IC device 110 shown in FIG. 2, IC device 310 also has nine metal layers m1–m9 stacked one on top of the other on top of a semiconductor substrate 410, which hosts a plurality of electrical components 430. Metal layers m1–m9 are further separated by eight dielectric layers d1–d8 and connected to each other by a plurality of vias such as v1–v8. A passivation layer 420 covers the upper surface of IC device 310. Components 430 are electrically connected with one another and bonding pads 345 through the conductive paths formed by the multiple metal layers, such as m2, m3, m4, m7 and m8 to the right of dotted line 335 as shown in FIG. 4.

A portion of passivation layer 420 on top of an elongated bonding pad 345 is removed to expose metal layer m9 for wire bonding and wafer sort probing. Elongated bonding pad 345 further comprises a bonding area 370 and a probing area 380. Similar to conventional bonding pad 145 shown in FIG. 2, bonding area 370 is supported by metal layers m1–m8, dielectric layers d1–d8, and vias v1–v8 to sustain the pressure caused by bonding equipments. Unlike conventional bonding pad 145 shown in FIG. 2, probing area 380 is deployed in the inner area 330 of IC device 310 in FIG. 3A or to the right of dotted line 335 in FIG. 4, because the pressure caused by the pin of a probing card is much less likely to damage electrical components 430.

Since probing area 380 is located in the inner area 330 of IC device 310, only bonding area 370 has a full set of overlapping metal layers m1–m8 below it to sustain wire bonding pressure and in contrast, there may be only a smaller number of the metal layers such as m7 and m8 below probing area 380 because the magnitude of wafer sort probing pressure is significantly smaller. As a result, less space is required on the upper surface of IC device 310 for elongated bonding pads and more space can be used for fabricating electrical components. Meanwhile, the dimension of probing area 380 can be at least 60 microns long, preferably 75 microns long, for a better contact with the probing pin of a probing card. Furthermore, the dimension of bonding area 370 can shrink independently to accommodate a thinner bonding wire without affecting the dimension of probing area 380.

The foregoing description, for purposes of explanation, used specific nomenclature to provide a thorough understanding of the invention. However, it will be apparent to one skilled in the art that the specific details are not required in order to practice the invention. For example, the invention is not limited to bonding pads having the specific shape disclosed in FIGS. 3A, 3B, and 4; nor is the invention limited to devices in which electrical components are not formed underneath the bonding pad. The embodiments were chosen and described in order to best explain the principles of the invention and its practical applications, to thereby enable others skilled in the art to best utilize the invention and various embodiments with various modifications as are suited to the particular use contemplated. Thus, the foregoing disclosure is not intended to be exhaustive or to limit the invention to the precise forms disclosed. Many modifications and variations are possible in view of the above teachings.

It is intended that the scope of the invention be defined by the following claims and their equivalents.

What is claimed is:

1. A integrated circuit device, comprising:
   a semiconductor substrate having an upper surface, electrical components being formed in the semiconductor substrate;
   a plurality of metal layers on top of the upper surface of the substrate, conductive paths defined in the metal layers being connected to the electrical components; and
   a plurality of bonding pads disposed on top of the metal layers and connected thereto such that the electrical components are connected to selected bonding pads through the conductive paths, each bonding pad further comprising:
   a bonding area located above a region where each of the metal layers overlaps; and
   an elongated probing area located above a subset of the plurality of metal layers for receiving a probing pin of a probing card, the elongated probing area being electrically connected to the bonding area.

2. The integrated circuit device of claim 1, wherein the elongated probing area has a long dimension and a short dimension and the bonding area is connected to the short dimension of the elongated probing area.

3. The integrated circuit device of claim 2, wherein the long dimension of the elongated probing area is at least 75 microns long.

4. The integrated circuit device of claim 1, wherein the bonding area is substantially a square.

5. The integrated circuit device of claim 1, wherein the elongated probing area is substantially a rectangle.

6. A integrated circuit device, comprising:
   a semiconductor substrate having an upper surface, the substrate further comprising an inner area and an outer area, the inner area hosting a plurality of electrical components connected through a plurality of metal layers disposed on the upper surface of the substrate; and
   a plurality of bonding pads disposed on the conductive paths and connected thereto, each bonding pad further comprising:
   a bonding area connected to at least of one of the metal layers and located on top of the outer area of the substrate for receiving a bonding wire; and
   an elongated probing area connected to the bonding area and located on top of the inner area of the substrate for receiving a probing pin of a probing card;
   wherein the bonding area is located above a region where all the metal layers overlap and the probing area is located above a region where less than all the metal layers overlap.

7. The integrated circuit device of claim 6, wherein the elongated probing area comprises one metal layer and at least one of the electrical components is directly below the probing area.

8. The integrated circuit device of claim 6, wherein the bonding area is substantially a square and the elongated probing area is substantially a rectangle.

9. The integrated circuit device of claim 6, wherein the elongated probing area has a long dimension and a short dimension and the bonding area is connected to the short dimension of the elongated probing area.

10. The integrated circuit device of claim 6, wherein the long dimension of the elongated probing area is at least 75 microns long.

* * * * *

UNITED STATES PATENT AND TRADEMARK OFFICE
CERTIFICATE OF CORRECTION

| | |
|---|---|
| PATENT NO. | : 7,091,613 B1 |
| APPLICATION NO. | : 10/699118 |
| DATED | : August 15, 2006 |
| INVENTOR(S) | : Jon M. Long and Joseph W. Foerstel |

It is certified that error appears in the above-identified patent and that said Letters Patent is hereby corrected as shown below:

Claim 6, line 8, after "the", delete "conductive paths" and substitute therefor --metal layers--.

Claim 10, line 1, after "claim", delete "6" and substitute therefor --9--.

Signed and Sealed this

Thirteenth Day of July, 2010

David J. Kappos
*Director of the United States Patent and Trademark Office*

UNITED STATES PATENT AND TRADEMARK OFFICE
CERTIFICATE OF CORRECTION

PATENT NO.        : 7,091,613 B1                                              Page 1 of 1
APPLICATION NO. : 10/699118
DATED             : August 15, 2006
INVENTOR(S)       : Jon M. Long and Joseph W. Foerstel It is certified that error appears in the above-identified patent and that said Letters Patent is hereby corrected as shown below:

Column 8, lines 5-6, (Claim 6, line 8), after "the", delete "conductive paths" and substitute therefor --metal layers--.

Column 8, line 30, (Claim 10, line 1), after "claim", delete "6" and substitute therefor --9--.

This certificate supersedes the Certificate of Correction issued July 13, 2010.

Signed and Sealed this

Seventeenth Day of August, 2010

David J. Kappos
*Director of the United States Patent and Trademark Office*